(12) United States Patent
Kim et al.

(10) Patent No.: US 7,608,994 B2
(45) Date of Patent: Oct. 27, 2009

(54) WHITE LIGHT EMITTING DEVICE

(75) Inventors: Bum Joon Kim, Seoul (KR); Tae Geun Kim, Gyunggi-Do (KR); Young Chul Shin, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 411 days.

(21) Appl. No.: 11/723,961

(22) Filed: Mar. 22, 2007

(65) Prior Publication Data

US 2007/0228935 A1    Oct. 4, 2007

(30) Foreign Application Priority Data

Mar. 22, 2006   (KR)  ............... 10-2006-0026039

(51) Int. Cl.
  *H01J 1/62*   (2006.01)
  *H01J 63/04*   (2006.01)

(52) U.S. Cl. .............. 313/503; 313/483; 313/498; 313/505; 313/506; 252/301.4 R; 428/690; 428/917

(58) Field of Classification Search ............... None
See application file for complete search history.

(56) References Cited

U.S. PATENT DOCUMENTS

| | | | |
|---|---|---|---|
| 6,404,125 B1 * | 6/2002 | Garbuzov et al. ......... | 313/499 |
| 6,696,703 B2 * | 2/2004 | Mueller-Mach et al. ....... | 257/98 |
| 2005/0269582 A1 | 12/2005 | Mueller et al. | |
| 2006/0065900 A1 * | 3/2006 | Hsieh et al. .................. | 257/79 |
| 2007/0228931 A1 * | 10/2007 | Kim et al. .................. | 313/501 |
| 2008/0128735 A1 * | 6/2008 | Yoo et al. ..................... | 257/98 |

FOREIGN PATENT DOCUMENTS

| JP | 2004-363343 | 12/2004 |
|---|---|---|
| JP | 2006-5367 | 1/2006 |

OTHER PUBLICATIONS

Korean Office Action, with English translation, Korean Patent Application No. KR 10-2006-0026039, mailed Jul. 27, 2007.

* cited by examiner

*Primary Examiner*—Nimeshkumar D. Patel
*Assistant Examiner*—Natalie K Walford
(74) *Attorney, Agent, or Firm*—McDermott Will & Emery LLP

(57) ABSTRACT

A high quality white light emitting device suitable for miniaturization. The white light emitting device according to the present invention includes a substrate and a light emitting structure composed of an n-semiconductor layer, an active layer and a p-semiconductor layer. The light emission structure emits first emission light. The white light emitting device also includes a wavelength-converting film for absorbing and converting the first emission light to second emission light of another wavelength. The wavelength-converting film is made of europium-silicate.

12 Claims, 18 Drawing Sheets

WHITE LIGHT EMITTING DEVICE

CLAIM OF PRIORITY

This application claims the benefit of Korean Patent Application No. 2006-0026039 filed on Mar. 22, 2006, in the Korean Intellectual Property Office, the disclosure of which is incorporated herein by reference.

BACKGROUND OF THE INVENTION

1. Field of the Invention

The present invention relates to a white light emitting device and, more particularly, to a white light emitting device which uses a wavelength-converting film made of europium-silicate to emit high quality white light.

2. Description of the Related Art

Recently, applications for Light Emitting Diodes (LEDs) have been expanding. High-luminance white light emitting devices have been expanded in their applications ranging from backlights for liquid crystal displays, traffic lights to general illumination. For general illumination, the light emitting devices need to have high luminance and be available at affordable price, which is determined by the technology that enables mass production.

A representative conventional white light emitting device is realized by combining a GaN blue LED and a YAG-based yellow phosphor. The blue light emitted from the blue LED excites the yellow phosphor to emit white light. The mixture of the blue light and the yellow light is perceived as white light by an observer. This is the most widely used configuration, in which the yellow phosphor has high efficiency of near 90% and the blue LED has high efficiency as well, enabling fabrication of a high-luminance product through an easy process. On the other hand, it is difficult to obtain a uniform color from individual products and color changes may occur according to the temperature of the surroundings.

FIG. 1 illustrates a conventional white light emitting device 50. As shown in FIG. 1, a blue LED 4 made of a gallium nitride-based semiconductor is mounted on a mount 5 disposed on a metal stem 3 that forms a reflecting cup 10. The blue LED 4 has one electrode connected to a lead frame 2 by a bonding wire and the other electrode connected to another lead frame 1 by another bonding wire 6. The reflecting cup 10 is filled with an inner encapsulant 8. The lead frames 1 and 2 are sealed by an outer encapsulant 9. A phosphor 11 contained in the inner encapsulant 8 absorbs the blue light emitted from the blue LED 4 to produce a different wavelength of light. For example, the YAG-based yellow phosphor absorbs blue light to emit yellow light. The mixture of the blue light and the yellow light is perceived as white light by an observer, as a result.

However, as the phosphor has to be contained in the inner encapsulant, the white light emitting device 50 has a large size and it is difficult to obtain a uniform color if the phosphor is not distributed evenly inside the inner encapsulant. In addition, combination of the blue LED 4 and the yellow TAG-based phosphor yields low color reproducibility.

A white light emitting device can also be realized by combining a blue LED, a green LED and a red LED. This method reduces the conversion loss of the phosphor and achieves high color reproducibility, but is expensive. With this white light emitting device, destruction of even one chip hinders production of white light.

Furthermore, an UV LED can be combined with red/green/blue phosphor to realize a white light emitting device. This white light emitting device is manufactured through an easy process but has low color reproducibility with a limited level of luminance due to the low efficiency of the red phosphor at below 40%.

SUMMARY OF THE INVENTION

The present invention has been made to solve the foregoing problems of the prior art and therefore an aspect of the present invention is to provide a high quality white light emitting device which easily obtains a uniform color, has superior color reproducibility and is suitable for miniaturization.

According to an aspect of the invention, the invention provides a white light emitting device which includes: a substrate; a light emission structure comprising an n-semiconductor layer, an active layer and a p-semiconductor layer sequentially formed on the substrate, the light emission structure emitting first emission light; and a wavelength-converting film for absorbing and converting the first emission light to second emission light of another wavelength, wherein the wavelength-converting film comprises europium-silicate. A portion of the first emission light can be combined with the second emission light to produce white light. Each of the p-semiconductor layer, the active layer and the n-semiconductor layer can be made of a nitride semiconductor.

The europium-silicate can be made of a material having a composition formula of $Eu_xSi_yO_z$, where $0<X<30$, $0<Y<30$ and $0<Z<30$. Preferably, the europium-silicate can be made of a material having a composition formula of $Eu_xSi_yO_z$, where, $0<x<10$, $0<y<10$ and $0<z<10$. More preferably, the europium-silicate may be made of a material having a composition formula of $Eu_xSi_yO_z$, where $0<x<6$, $0<y<6$ and $0<z<6$.

The wavelength-converting film can be formed on at least one location selected from the group consisting of a bottom surface of the substrate, an upper surface of the p-semiconductor layer and between the substrate and the n-semiconductor layer.

According to an exemplary embodiment of the present invention, the first emission light can be blue light, and the second emission light can be light in a wavelength range from green to red, or yellow light.

According to an exemplary embodiment of the present invention, the first emission light can be light in a wavelength range from blue to green, and the second emission light can be yellow light.

In addition, according to an exemplary embodiment of the present invention, the first emission light can be ultraviolet rays., and the second emission light can be light in a wavelength range from blue to red.

According to an exemplary embodiment of the present invention, white light is emitted in a direction from the light emission structure upward, opposite to the substrate.

According to an exemplary embodiment of the present invention, white light is emitted in a direction from the substrate downward, opposite to the light emission structure.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
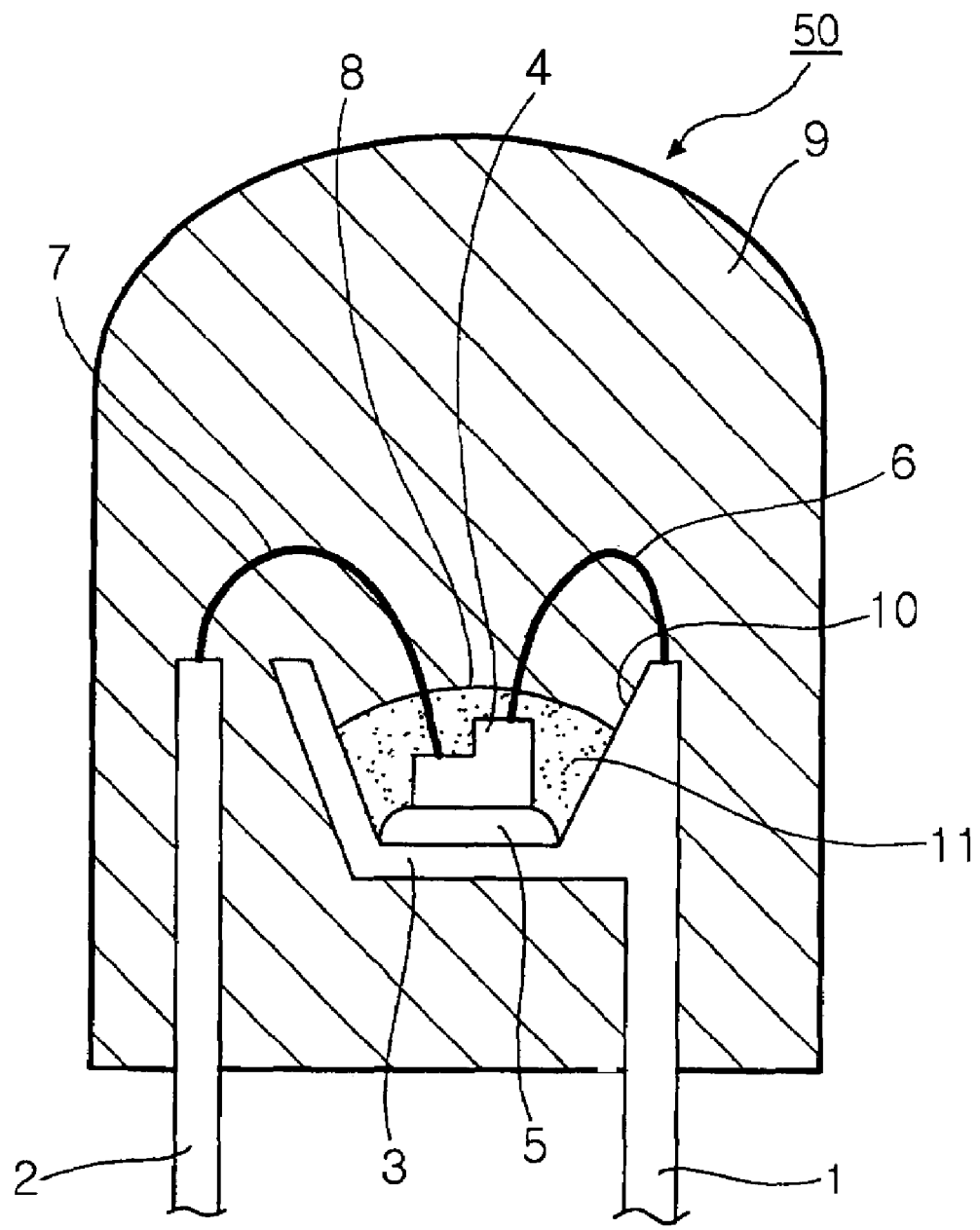
FIG. 1 is a view illustrating a conventional white light emitting device.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity and the same reference numerals are used throughout to designate the same or similar components.

In the specification, 'nitride semiconductor' refers to a binary, ternary or quaternary compound semiconductor expressed by a composition formula of $Al_xGa_yIn_{(1-x-y)}N$, where $0 \leq x \leq 1$, $0 \leq y \leq 1$ and $0 \leq x+y \leq 1$.

Figure 2:
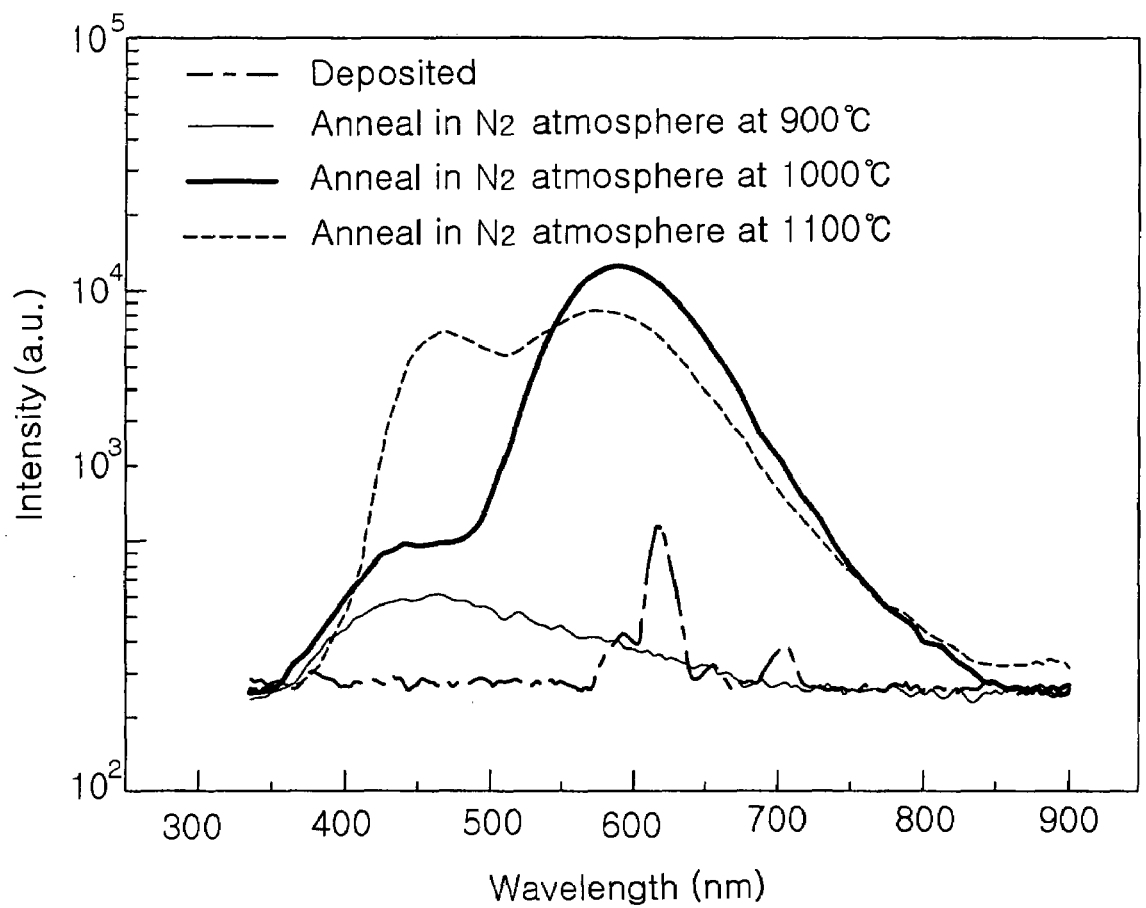
FIG. 2 is a graph illustrating various light emission spectrums of europium-silicate.

FIG. 2 is a graph illustrating the light emission spectrums of europium-silicate. In particular, FIG. 2 shows the light emission spectrums of europium-silicate formed by sputtering using $Eu_2O_3$ and Si targets as sources. The graph presents the light emission spectrums of the deposited europium-silicate at various heat treatment temperatures. Referring to FIG. 2, the europium-silicate heat-treated to 1000° C. is excited by ultraviolet rays or blue light to emit light in a wavelength range from green to red and exhibits the maximum intensity at a yellow wavelength of about 570 nm. Therefore, the europium-silicate and the blue LED can be combined to realize white light. In addition, the europium-silicate heat-treated to 1100° C. emits light in a wide wavelength range from blue to red with a considerable level of intensity. Therefore, the europium-silicate can be combined with an ultraviolet LED to achieve white light.

As described, the source (or composition) or the heat-treatment can be varied to change the light emission spectrum of the europium-silicate. Therefore, europium-silicate having various light emission spectrums according to different compositions or phases can be combined with an LED emitting various wavelengths of light to fabricate a white light emitting device.

A composition of europium-silicate can be seen through an X-ray analysis. The europium-silicate usable for wavelength conversion can be made of a material having a formula of $Eu_xSi_yO_z$, where, $0<x<30$, $0<y<30$ and $0<z<30$, preferably of $Eu_xSi_yO_z$, where $0<x<6$, $0<y<6$ and $0<z<6$, and more preferably of $Eu_xSi_yO_z$, where $0<x<6$, $0<y<6$ and $0<z<6$.

Figure 3:
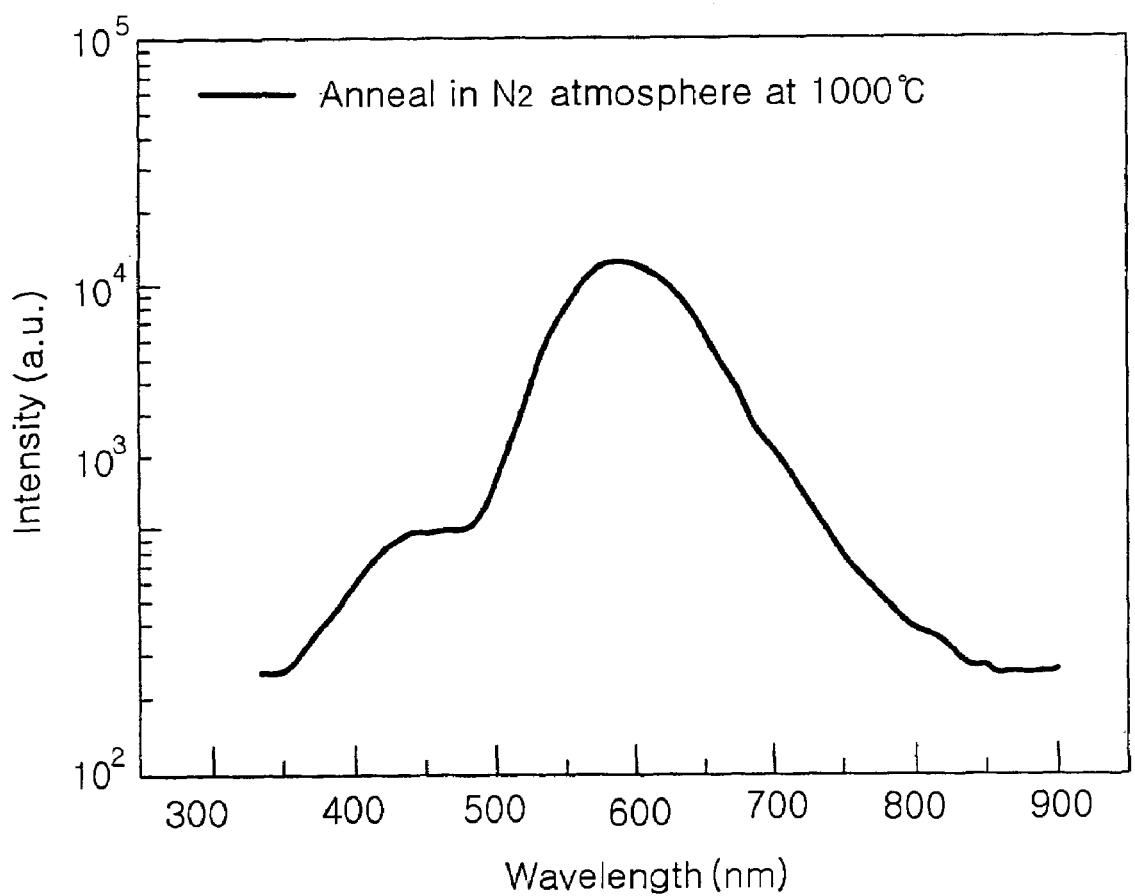
FIG. 3 is a graph illustrating a light emission spectrum of europium-silicate used in an embodiment of the present invention.

FIG. 3 is a graph showing a light emission spectrum of the europium-silicate which was deposited using $Eu_2O_3$ and Si targets as sources and heat-treated to 1000° C. in $N_2$ atmosphere. This light emission spectrum is obtained by using blue to ultraviolet rays as excitation light. As shown in FIG. 3, the europium-silicate exhibits light in a wavelength range from green to red and has the maximum intensity in the yellow wavelength of about 570 nm. Therefore, the europium-silicate can be utilized as a phosphor (or wavelength-converting material) which can absorb blue light to emit the light in a wavelength range from green to red, or yellow light. The white light emitting device using the europium-silicate of FIG. 3 is shown in FIGS. 5 and 6, FIGS. 10 and 11 and FIGS. 15 and 16.

Figure 4:
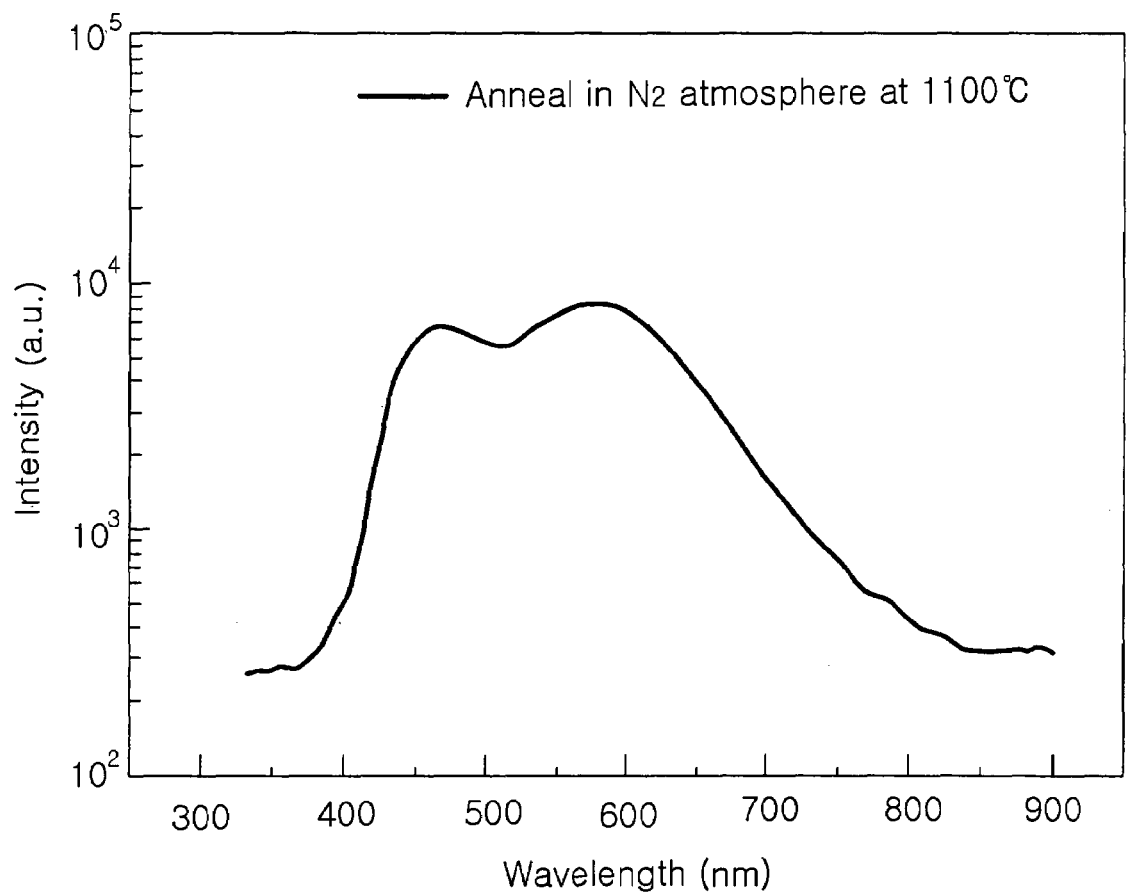
FIG. 4 is a graph illustrating a light emission spectrum of europium-silicate used in another embodiment of the present invention.
Figure 9:
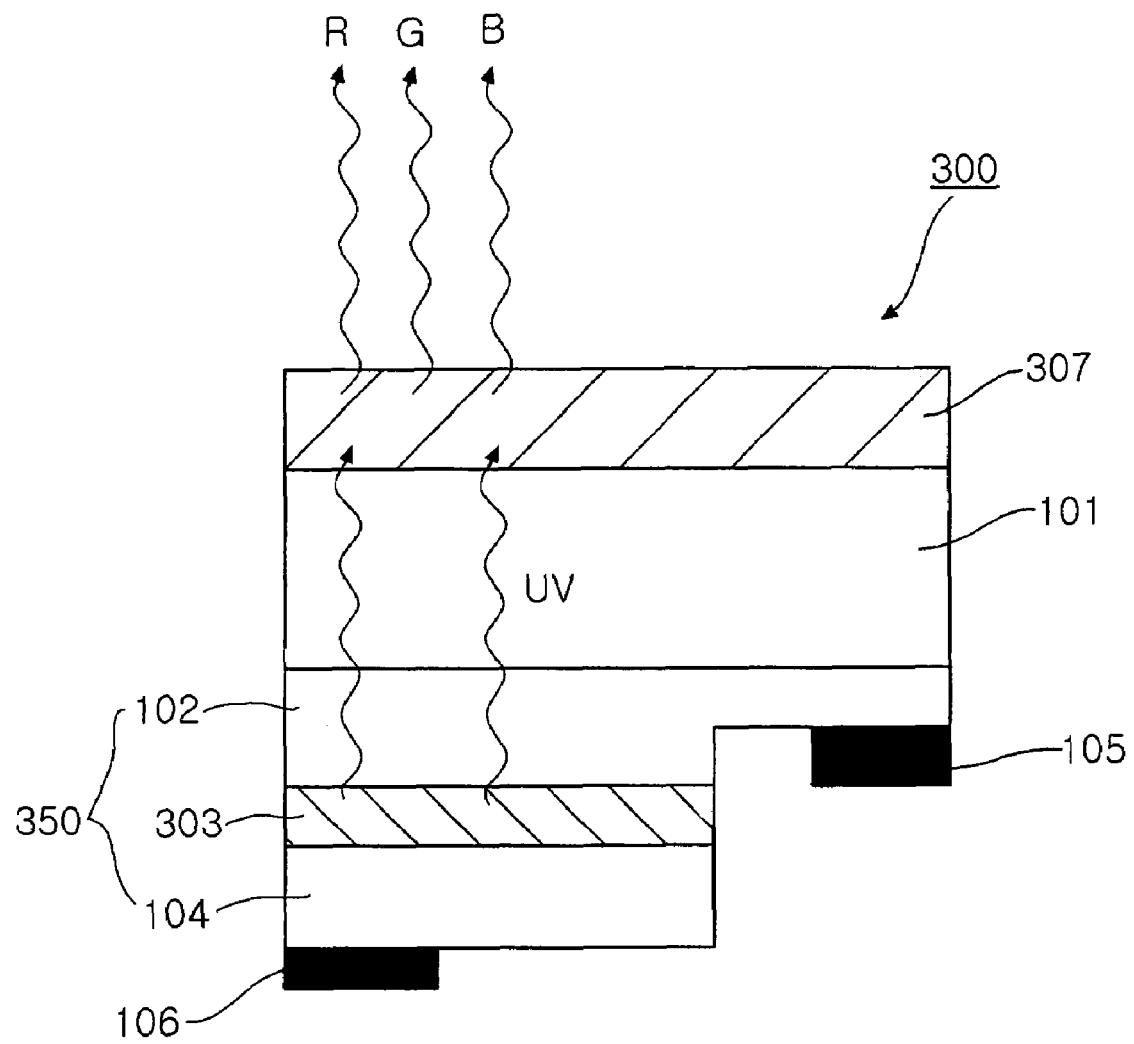
Figure 14:
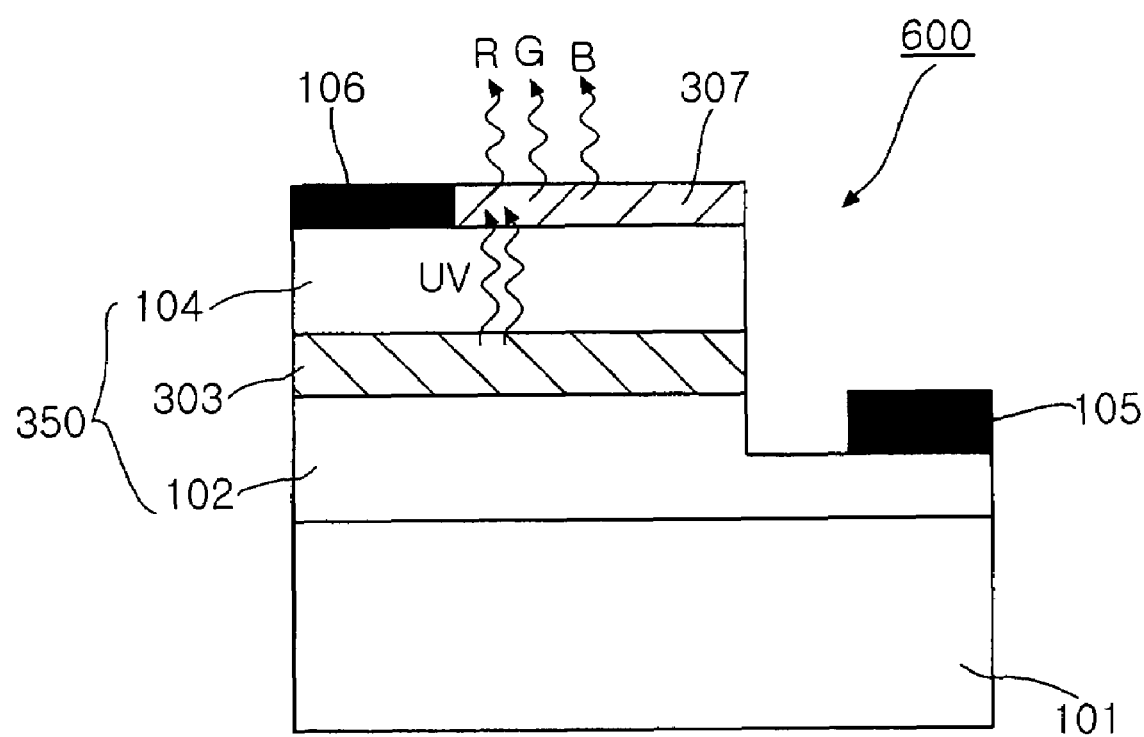

FIG. 4 is a graph showing the light emission spectrum of europium-silicate, which is deposited using $Eu_2O_3$ and Si targets as sources, heat treated to 1100° C. in $N_2$ atmosphere, and excited by ultraviolet rays (325 nm). As shown in FIG. 3, the light emission spectrum exhibits a considerable intensity in a wide wavelength range from blue to red. This light emission spectrum is suitable for a spectrum of white light. The white light emitting device using the europium-silicate of FIG. 4 is shown in FIGS. 9 and 14.

Figure 5:
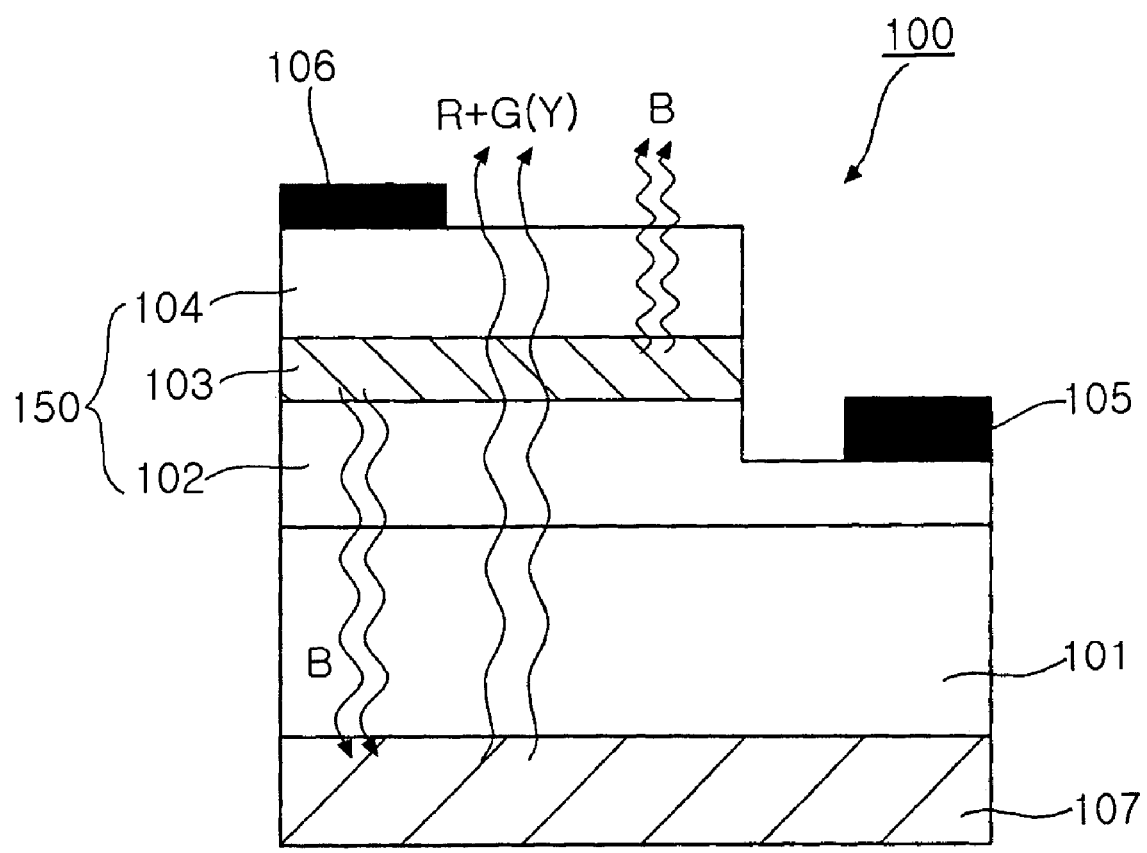
FIGS. 5 to 18 are sectional views illustrating white light emitting devices according to various embodiments of the present invention.

FIG. 5 is a sectional view illustrating a white light emitting device according to an embodiment of the present invention. Referring to FIG. 5, the white light emitting device 100 includes a light emitting structure 150 formed on a substrate 101. The light emission structure 150 includes an n-semiconductor layer 102, an active layer 103 and a p-semiconductor layer 104. The light emission structure 150 has a mesa structure formed by exposing a portion of the n-semiconductor layer. In addition, an n-electrode 105 is formed on the exposed portion of the n-semiconductor layer 102, and a p-electrode 106 is formed on the p-semiconductor layer 104. A wavelength-converting film 107 is formed on a bottom surface of the substrate 101. The light emission structure 150 is made of a nitride semiconductor such as GaN and emits blue light B. The device 100 emits white light in a direction toward the upper surface of the light emission structure 150 opposite from the substrate 101. That is, the upper surface of the p-semiconductor layer 104 is the light exiting surface.

The substrate 101 can be one selected from a sapphire substrate, a silicon carbide SiC substrate, and a GaN substrate. The sapphire substrate is relatively low-cost and is stable at high temperature, thus widely used as a substrate for a blue or green light emitting device.

The light emission structure 150 can be made of a nitride semiconductor material. The light emission structure of a nitride semiconductor can be formed through a deposition process such as, for example, Metal Organic Chemical Vapor Deposition (MOCVD), Molecular Beam Epitaxy (MBE) or Hydride Vapor Phase Epitaxy (HVPE).

The active layer 103 emits light by electron-hole recombination and preferably has a single or multiple quantum well structure. For example, the active layer 103 is made of a nitride semiconductor layer such as InGaN or GaN. In the active layer 103, blue light, which is the first emission light, is generated. A portion of the blue light B is emitted through an upper surface of the p-semiconductor layer 104 and another portion passes through the substrate 101 to be absorbed by the wavelength-converting thin film 107. The absorbed portion of the blue light B is converted to the light R+G in a wavelength range from green and red by the wavelength-converting thin film 107.

The wavelength-converting film 107 is made of europium-silicate. The europium-silicate is a silicate material doped with europium, and has a composition formula of $Eu_xSi_yO_z$, where, $0<x<30$, $0<y<30$ and $0<z<30$. Preferably, the europium-silicate has a composition formula of $Eu_xSi_yO_z$, where, $0<x<10$, $0<y<10$ and $0<z<10$, and more preferably, $Eu_xSi_yO_z$, where, $0<x<6$, $0<y<6$ and $0<z<6$. In general, the europium-silicate can have various light emission spectrums according to the composition formulae and phases (see FIGS. 2 to 4). In addition, in accordance with the heat treatment atmosphere (oxygen, nitrogen, hydrogen, etc.), the shape, intensity, Full Width at Half Maximum (FWHM), etc. of the spectrum can be adjusted.

The wavelength-converting film 107 made of the europium-silicate can be fabricated by existing methods for deposition or growth such as sputtering, Chemical Vapor Deposition (CVD), Plasma Enhanced CVD, Metal Organic CVD, etc.

Referring to FIG. 5, the first emission light generated at the active layer 103 is blue light B. A portion of the first emission light B passes through the substrate 101 to be absorbed in the wavelength-converting film 107. The wavelength-converting film 107 converts the absorbed portion of the first emission light B to the second emission light of another wavelength. The second emission light is the light R+G in a wavelength range from green to red, or yellow light Y. Such a wavelength-converting film 107 can be made of the europium-silicate having the spectrum of FIG. 3. In this case, a reflecting layer can be formed on a bottom surface of the wavelength-converting film 107 to facilitate light emission through an upper surface of the p-semiconductor layer 104, which is the light exiting surface. The mixture of the blue light B generated from the light emission structure 150 and the light R+G in a wavelength range from green to red, which is converted by the wavelength-converting film 107 to be emitted or the yellow light Y is perceived as white light by an observer.

As described herein, a white light emitting device can achieve white light by using the wavelength-converting film of europium-silicate, without a package for containing phosphor, thus allowing miniaturization of the white light emitting device. In addition, the europium-silicate is formed by deposition, and thus can be formed in a uniform thickness. This facilitates obtaining a uniform color from individual products with superior color reproducibility of white output light. Moreover, the europium-silicate can have various light emission spectrums according to its process conditions (compositions or phases). Therefore, the present invention advantageously facilitates color combination for producing white light. Furthermore, the present invention advantageously enables a simple manufacturing process with reduced manufacturing costs.

Figure 6:
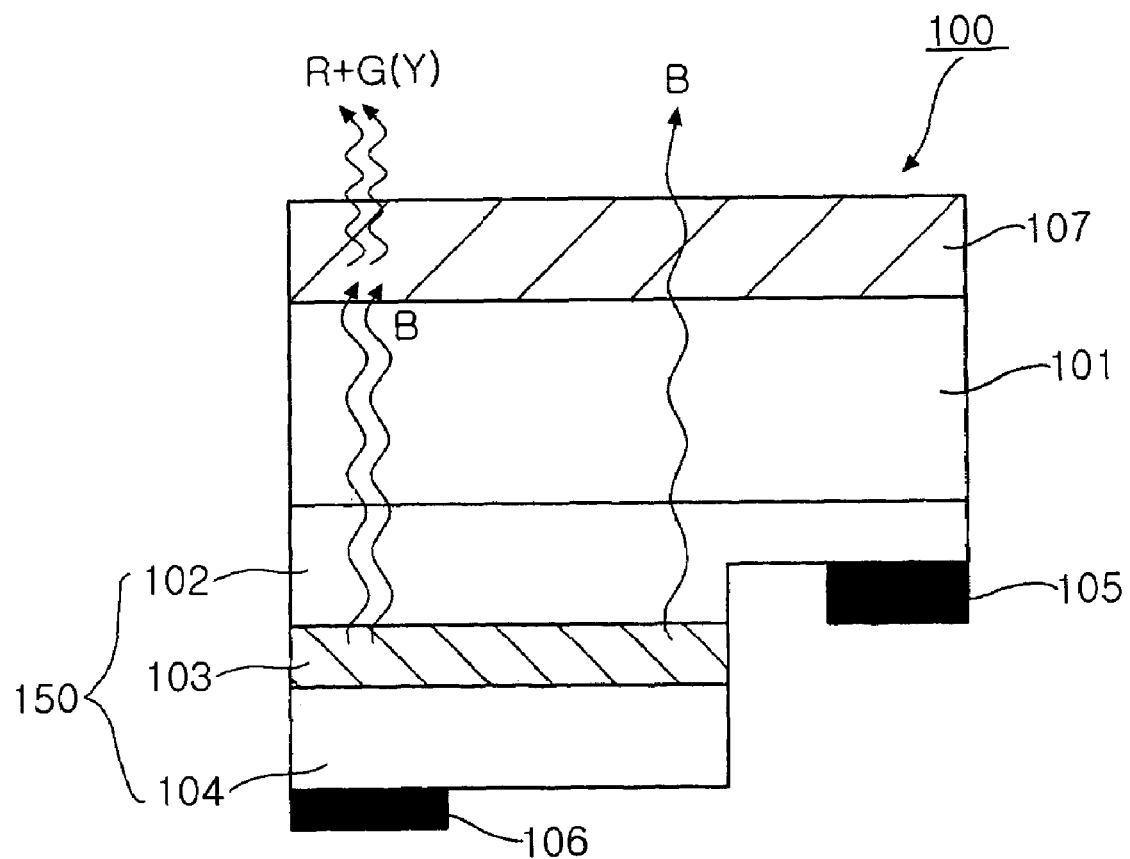

FIG. 6 is a sectional view illustrating a white light emitting device 100' according to another embodiment of the present invention. The embodiment shown in FIG. 6 is a variation of the embodiment shown in FIG. 5, and differs in that the light exiting surface is in the opposite direction. That is, as shown in FIG. 6, the surface of the wavelength-converting film 107 opposite to the substrate 101 is the light exiting surface. To facilitate emission of light, a reflecting layer may be formed on a bottom surface of the p-semiconductor layer. The first emission light (blue light B) generated from the active layer 103 in the light emissions structure 150 and the second emission light (the light R+G in a wavelength range from green to red, or yellow light Y) obtained from the wavelength-converting film 107 are identical to those described in the afore-descirbed embodiment shown in FIG. 5. A portion of the first emission light B is emitted through an upper surface of the wavelength-converting film 107 without wavelength conversion, and another portion is absorbed in the wavelength-converting film 107 and converted to the light R+G in a wavelength range from green to red, or yellow light Y and emitted. The white light emitting device 100' achieves white light by the mixture of the first emission light B generated from the light emission structure 150 and the second emission light R+G or Y. In a case where the device of FIG. 6 is overturned to have the substrate face down, the white light is emitted in a direction from the substrate 101 downward, opposite to the light emission structure 150.

Figure 7:
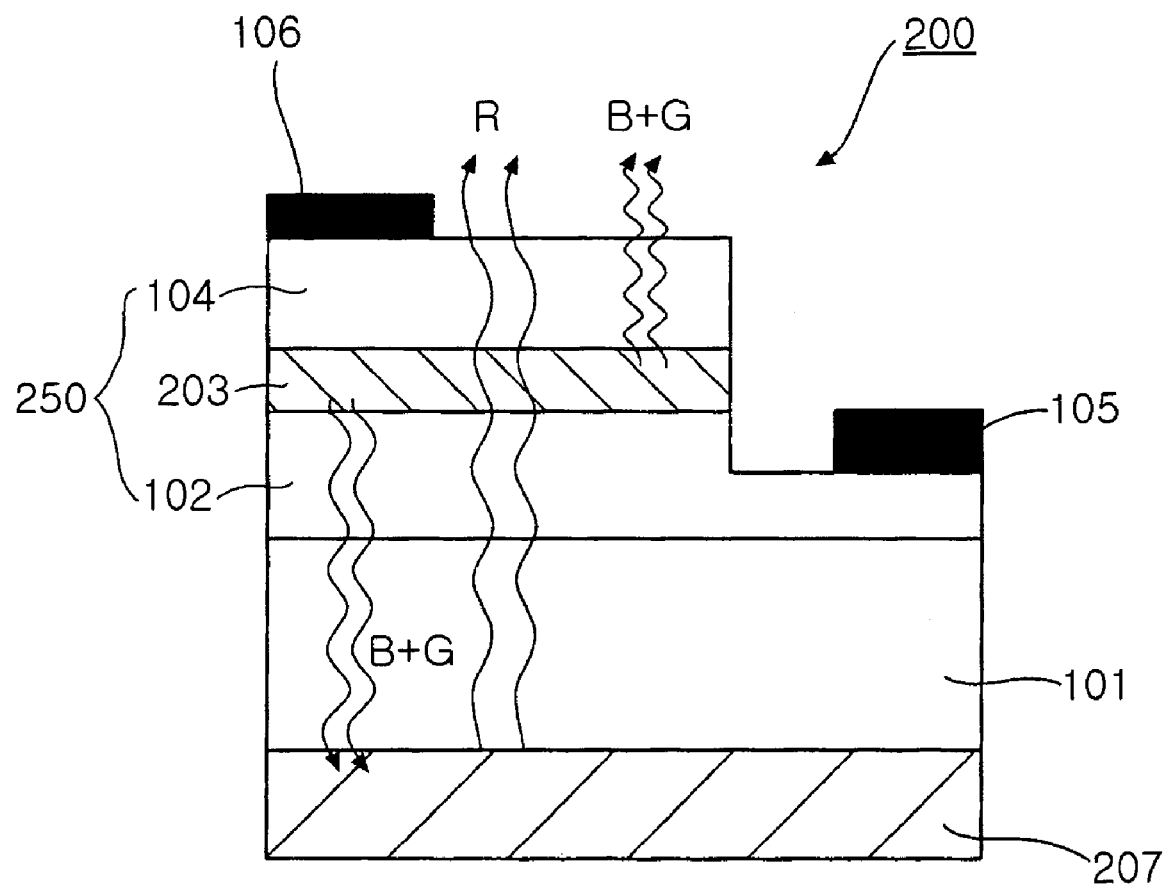

FIG. 7 is a sectional view illustrating a white light emitting device 200 according to further another embodiment of the present invention. The embodiment shown in FIG. 7 differs from the embodiment shown in FIG. 5 in that the first emission light generated from the light emission structure 250 is the light B+G in a wavelength range from blue to green and the wavelength-converting film 207 converts the first emission light B+G to the second emission light of red light R. A portion of the first emission light B+G generated from the active layer 203 in the light emission structure 250 is emitted through an upper surface of the p-semiconductor layer 104. Another portion of the first emission light B+G is absorbed in the wavelength-converting film 207 and converted to the second emission light R, which is then emitted through an upper surface of the p-semiconductor layer 104. The white light emitting device 200 achieves white light by the mixture of the first emission light B+G and the second emission light R. The white light is emitted in a direction from the light emission structure 250 upward, opposite to the substrate 101.

Figure 8:
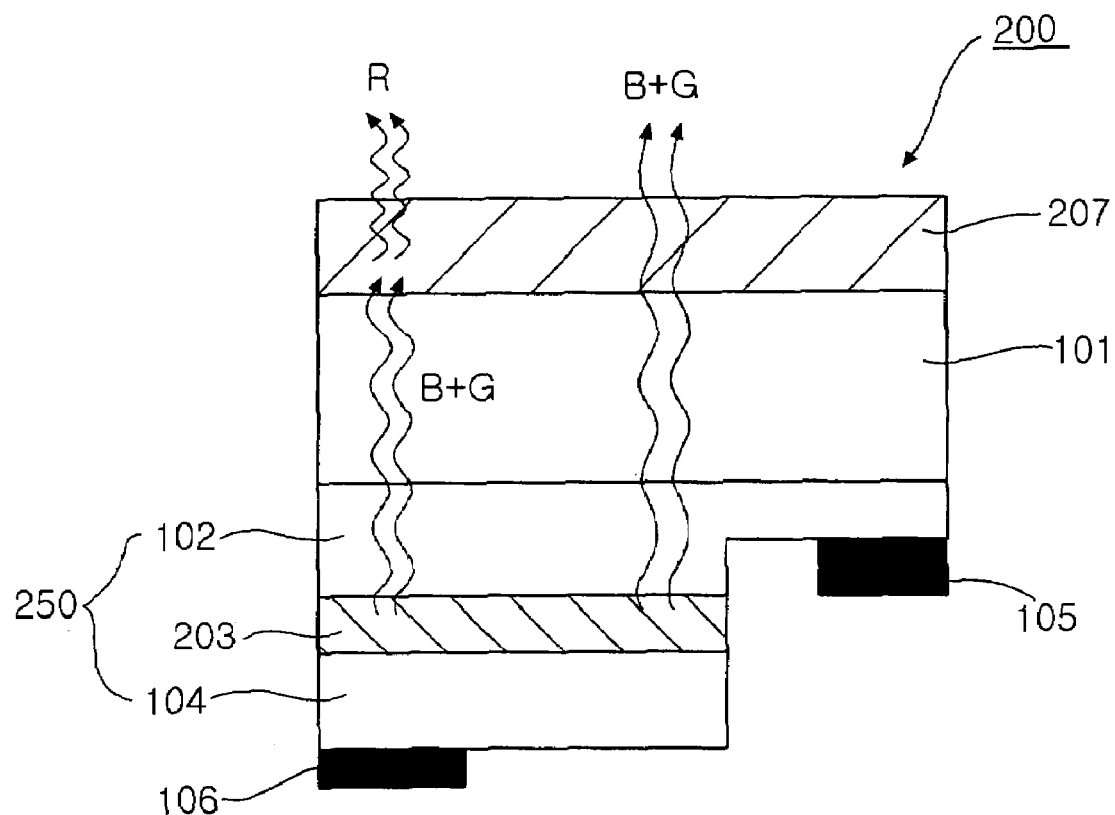

FIG. 8 is a view illustrating a variation of the embodiment shown in FIG. 7. The white light emitting device 200' of FIG. 8 differs from the white light emitting device 200 of FIG. 7 in that the light exiting surface is in the opposite direction. That is, as shown in FIG. 8, the surface of the wavelength-converting film 207 opposite to the substrate 101 is the light exiting surface. In order to facilitate emission of light through an upper surface of the wavelength-converting film 207, a reflecting layer can be formed on a bottom surface of the p-semiconductor layer 104. The first emission light (the light B+G in a wavelength range from blue to green) generated from the active layer 204 in the light emission structure 250 and the second emission light (red light R) obtained by the wavelength-converting film 107 are identical to those described in the embodiment shown in FIG. 7. A portion of the first emission light B+G is emitted through an upper surface of the wavelength-converting film 207 without wavelength conversion and another portion is absorbed in the wavelength-converting film 207 and converted to the second emission light R to be emitted. The white light emitting device 200' achieves white light by the mixture of the first emission light B+G generated from the light emission structure 250 and the second emission light R obtained by wavelength conversion.

FIG. 9 is a sectional view illustrating a white light emitting device 300 according to further another embodiment of the present invention. Referring to FIG. 9, the first emission light emitted from the active layer 303 in the light emission structure 350 is Ultraviolet (UV) rays. In addition, the wavelength-converting film 307 converts the first emission light UV to the second emission light, which is the light RGB in a wavelength range from blue to red, i.e. to white light. The second emission light RGB emitted from the wavelength-converting film is perceived as white light by an observer. As shown in FIG. 4, the europium-silicate which absorbs UV rays can emit white light having a uniform intensity in the wavelength range of 420 to 620 nm. Such europium-silicate can be used for the wavelength-converting film 307 to obtain white light with superior color reproducibility.

Figure 10:
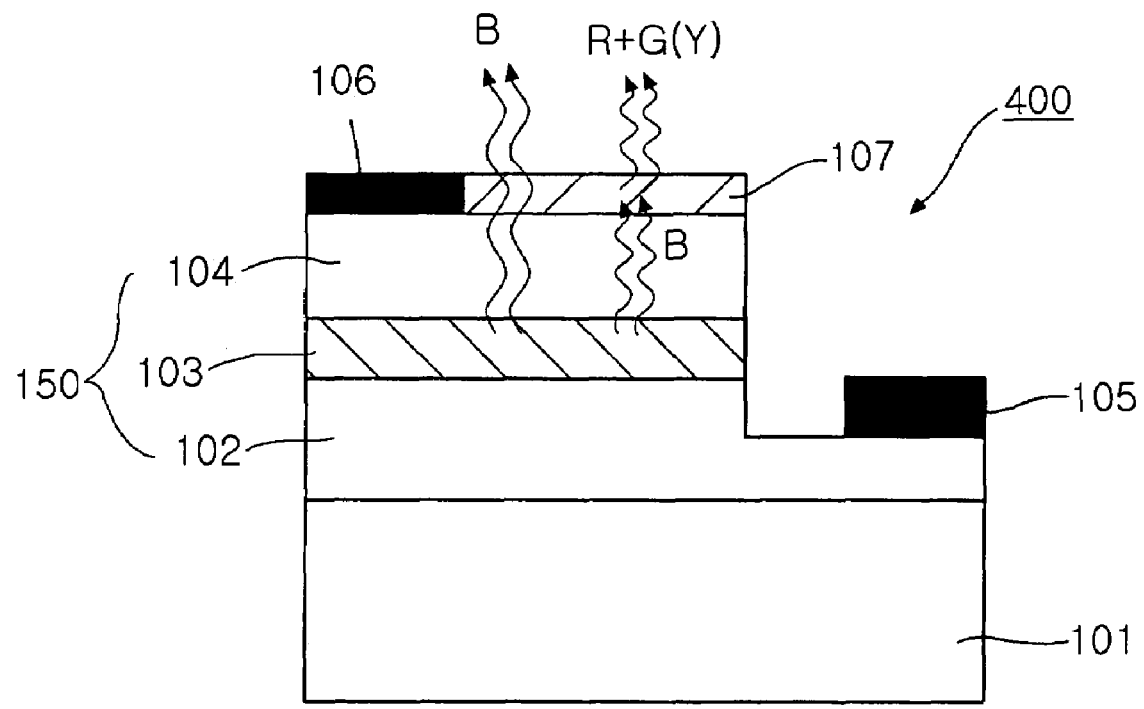

FIG. 10 is a sectional view illustrating a white light emitting device 400 according to further another embodiment of the present invention. The embodiment shown in FIG. 10 is a variation from the embodiment shown in FIG. 5, and differs in that the wavelength-converting film 107 is formed on the p-semiconductor layer 104. The light exiting surface is the upper surface of the wavelength-converting film 107, as shown in FIG. 10. Referring to FIG. 10, the first emission light generated from the active layer 103 in the light emission structure 150 is blue light B. A portion of the first emission light B passes through the wavelength-converting film 107 to be emitted without any wavelength conversion. Another portion of the first emission light B is absorbed in the wavelength-converting film 107. The wavelength-converting film 107 converts the absorbed portion of the first emission light B to the second emission light having another wavelength. The second emission light is the light R+G in a wavelength range from green to red, or yellow light Y. For such a wavelength-converting film 107, the europium-silicate having the spectrum of FIG. 3 can be used. In this case, a reflecting layer can be formed on a bottom surface of the substrate 101 to facilitate emission of light through an upper surface of the wavelength-converting film 107, which is the light exiting surface. The mixture of the first emission light B generated from the active layer 103 in the light emission structure 150 and the second emission light R+G or Y obtained from the wavelength-converting film 107 is perceived as white light by an observer.

Figure 11:
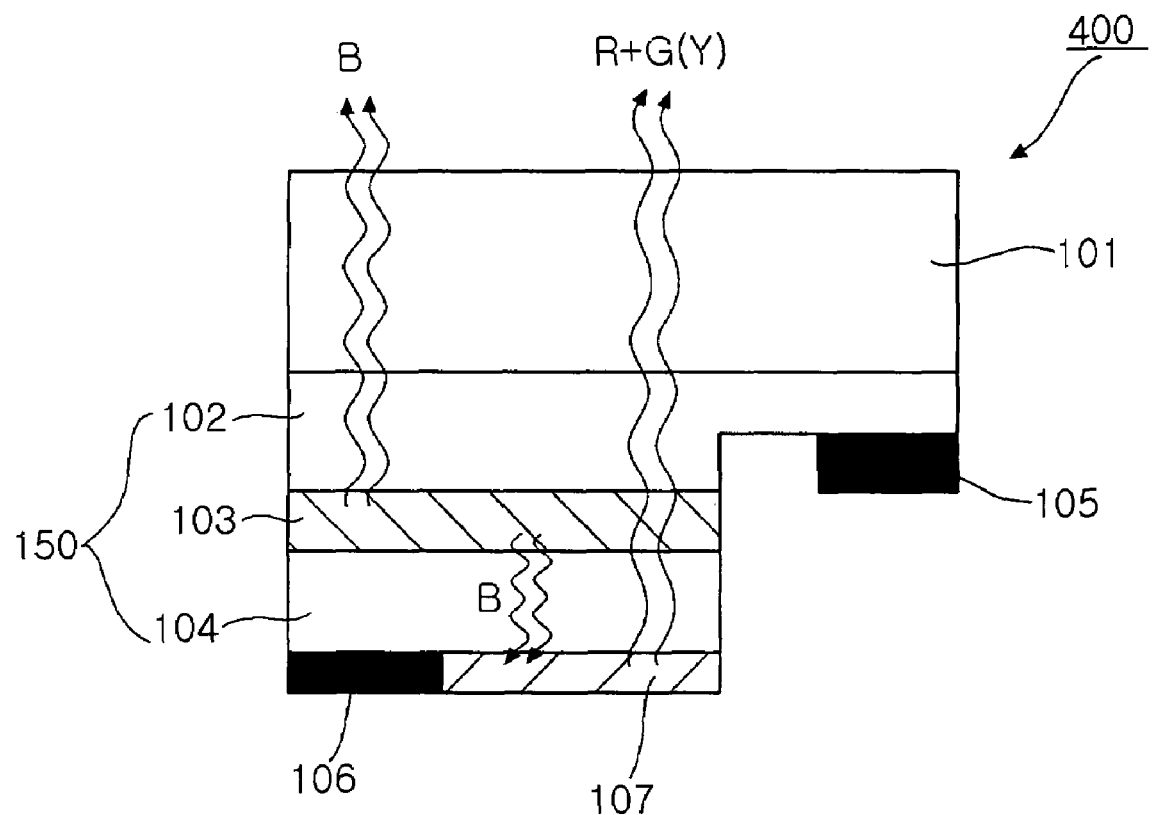

FIG. 11 is a sectional view illustrating a white light emitting device 400' according to further another embodiment of the present invention. The embodiment shown in FIG. 11 is a variation from the embodiment shown in FIG. 10, and differs in that the light exiting surface is in the opposite direction. That is, in this embodiment, the light exiting surface is the surface of the substrate 105 opposite to the light emission structure 150. Referring to FIG. 11, a portion of the first emission light B generated from the active layer 103 in the light emission structure 150 is emitted through an upper surface of the substrate 101 without wavelength conversion. Another portion of the first emission light B is absorbed in the wavelength-converting film 107. The wavelength-converting film 107 converts the absorbed portion of the first emission light B to the second emission light R+G or Y of another wavelength. The second emission light R+G or Y is emitted through an upper surface of the substrate 101. The white light emitting device 400' achieves white light by the mixture of the first emission light B and the second emission light R+G or Y.

Figure 12:
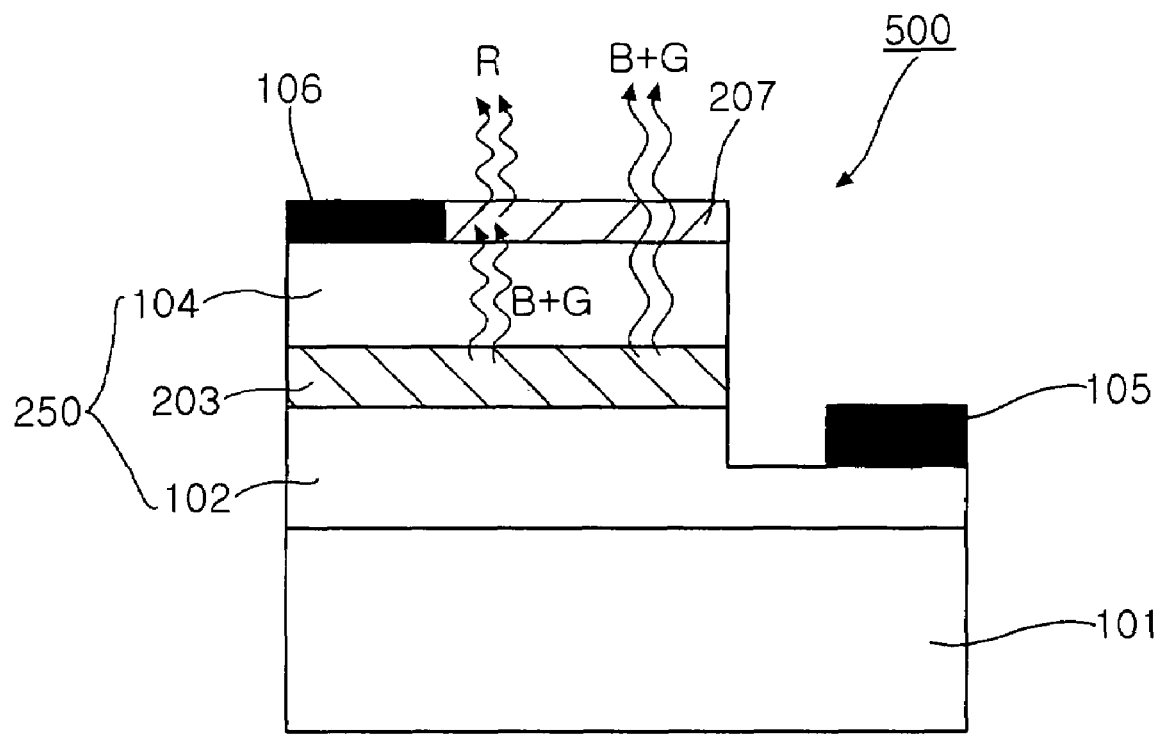

FIG. 12 is a sectional view illustrating a white light emitting device according to further another embodiment of the present invention. The embodiment shown in FIG. 12 differs from the embodiment of FIG. 7 in that the wavelength-converting film 207 is formed on the p-semiconductor layer 104. The light exiting surface is the upper surface of the wavelength-converting film 207. A portion of the first emission light B+G generated from the active layer 203 in the light emission structure 250 is emitted through an upper surface of the wavelength-converting film 207 without wavelength conversion. Another portion of the first emission light B+G is absorbed in the wavelength-converting film 207 to be converted to the second emission light R, which is then emitted through an upper surface of the wavelength-converting film 207. The white light emitting device 500 achieves white light by the mixture of the first emission light B+G and the second emission light R.

Figure 13:
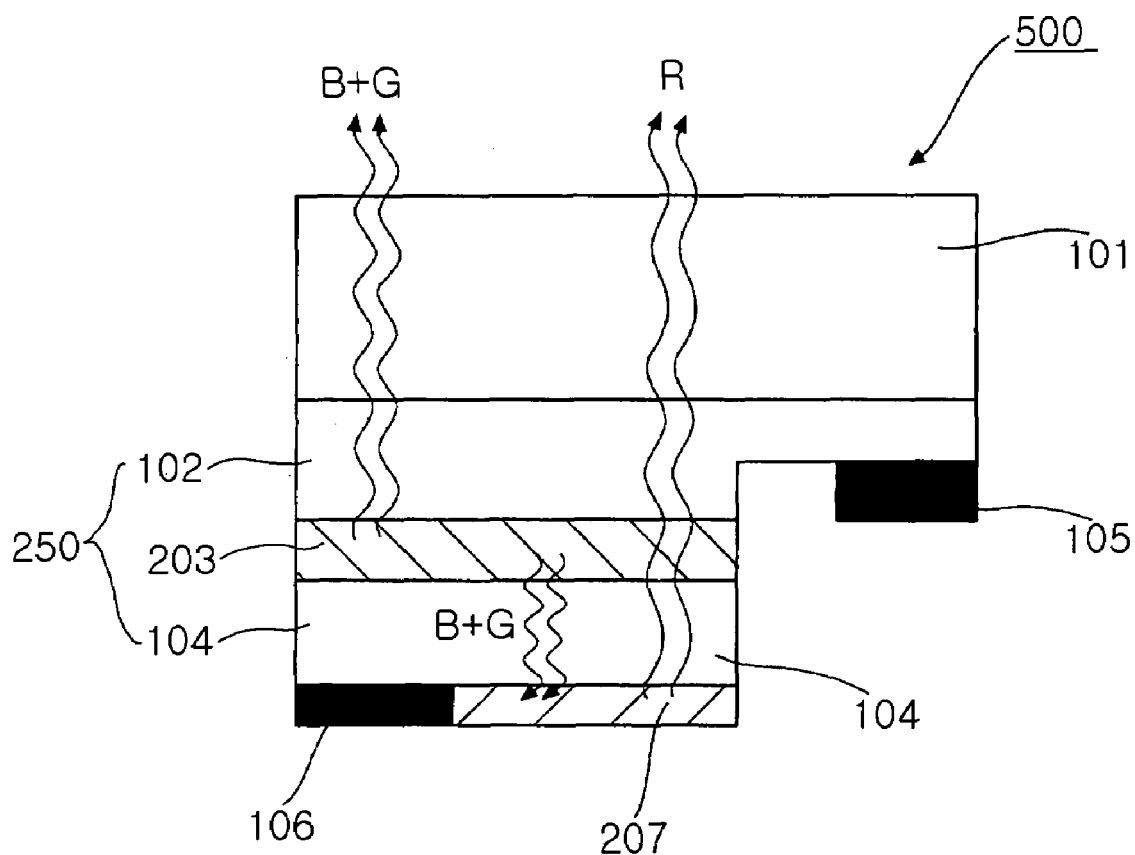

FIG. 13 is a sectional view illustrating a white light emitting device 500' according to further another embodiment of the present invention. The embodiment shown in FIG. 13 is a variation from the embodiment shown in FIG. 12, and differs in that the light exiting surface is in the opposite direction. That is, in the embodiment shown in FIG. 13, the surface of the substrate 101 opposite to the light emission structure 250 is the light exiting surface. To facilitate emission of light through the upper surface of the substrate 101, a reflecting layer can be formed on a bottom surface of the wavelength-converting film 207. A portion of the first emission light B+G generated from the active layer 203 in the light emission structure 250 is emitted through an upper surface of the substrate 101 without wavelength conversion, and another portion is absorbed in the wavelength-converting film 207 and converted to the second emission light R to be emitted through an upper surface of the substrate 101. The white light emitting device 200' achieves white light by the mixture of the first emission light B+G and the second emission light R.

FIG. 14 is a sectional view illustrating a white light emitting device 600 according to further another embodiment of the present invention. The embodiment shown in FIG. 14 is a variation from the embodiment shown in FIG. 10, and differs in that the first emission light emitted from the light emission structure 350 is UV rays and the wavelength-converting film 307 absorbs and converts the UV rays to the light RGB in a wavelength range from blue to red. The light emission spectrum of the wavelength-converting film 307 is illustrated in FIG. 4. Referring to FIG. 14, the light exiting surface is the upper surface of the wavelength-converting film 307. A reflecting layer can be formed on a bottom surface of the substrate 101 to emit light through an upper surface of the wavelength-converting film 307. The first emission light UV emitted from the active layer 303 in the light emission structure 350 is absorbed in the wavelength-converting film 307 and is converted to the second emission light RGB, i.e., white light. The second emission light RGB emitted from the wavelength-converting film 307 is perceived as white light by an observer.

Figure 15:
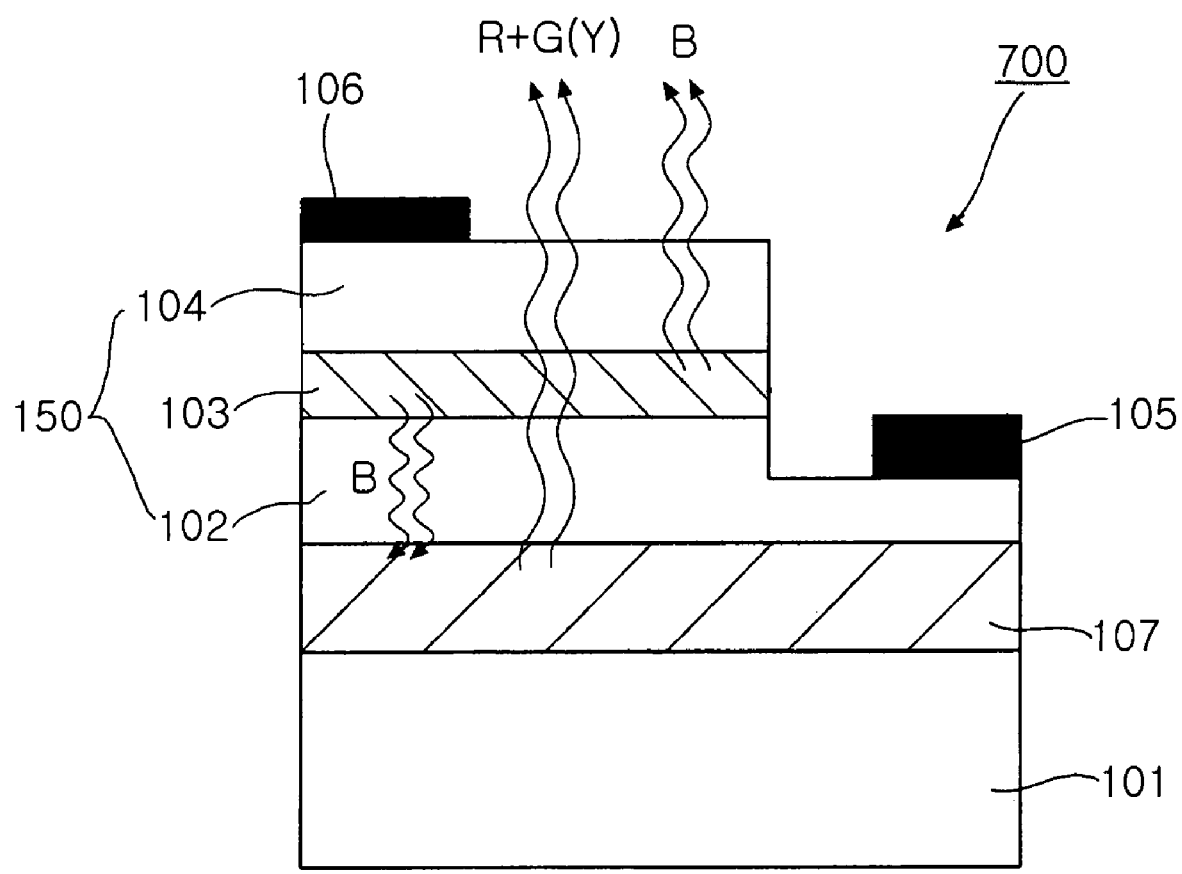

FIG. 15 is a sectional view illustrating a white light emitting device 700 according to further another embodiment of the present invention. The embodiment shown in FIG. 15 is a variation from the embodiment shown in FIG. 5, and both include, in common, the first emission light B emitted from the active layer 103 in the light emission structure 150, the second emission light R+G or Y emitted from the wavelength-converting film 107 and the same location of the light exiting surface (upper surface of the p-semiconductor layer). However, in this embodiment, the wavelength-converting film 107 is formed between the substrate 101 and the n-semiconductor layer 102.

Figure 16:
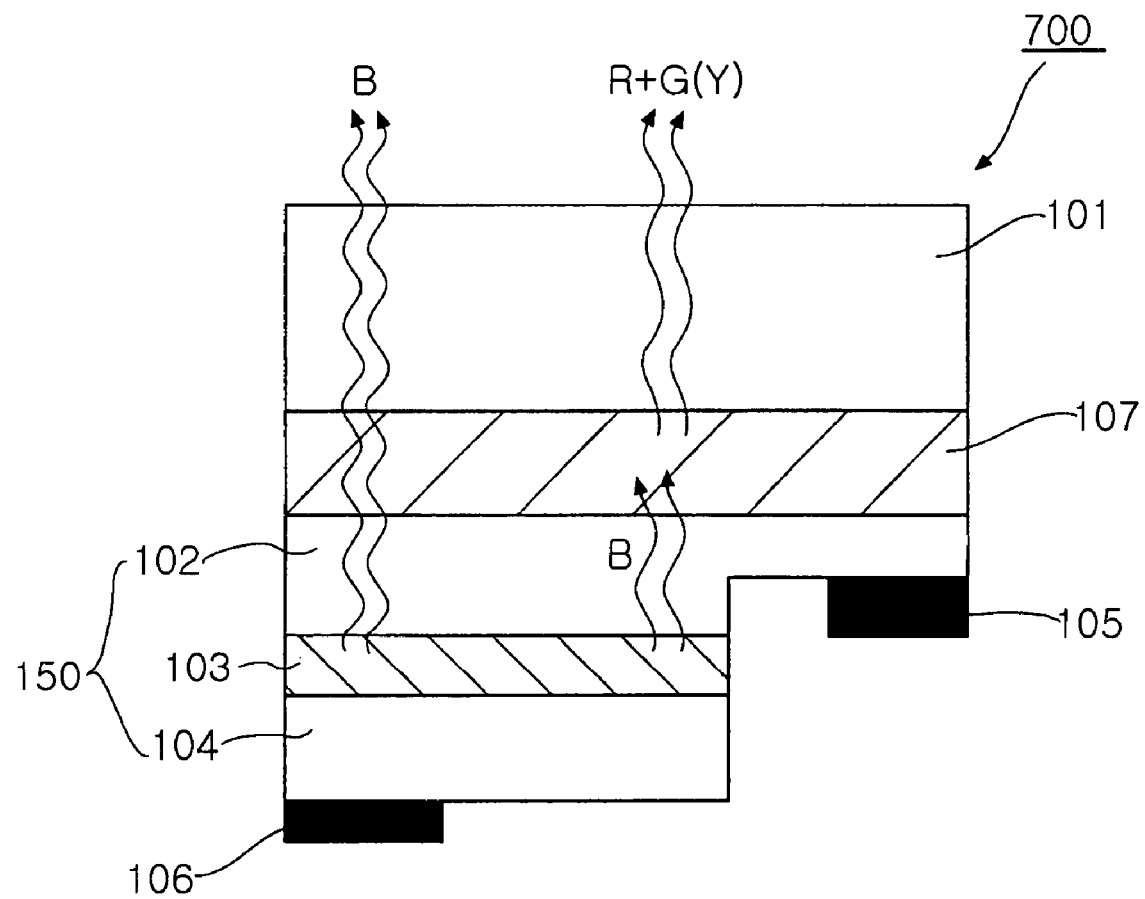

FIG. 16 is a sectional view illustrating a white light emitting device 700' according to further another embodiment of the present invention. The embodiment shown in FIG. 16 is a variation from the embodiment of FIG. 15, and differs in that the light exiting surface is in the opposite direction. That is, as shown in FIG. 16, the upper surface of the substrate 101 is the light exiting surface. To facilitate emission of light through an upper surface of the substrate 101, a reflecting layer can be formed on a bottom surface of the p-semiconductor layer. Referring to FIG. 16, a portion of the first emission light B generated from the active layer 103 in the light emission structure 150 passes through the wavelength-converting film 107 and is emitted through an upper surface of the substrate 101 without any wavelength conversion. Another portion of the first emission light B is absorbed in the wavelength-converting film 107. The wavelength-converting film 107 converts the absorbed portion of the first emission light B to the second emission light R+G or Y of another wavelength. The second emission light R+G or Y is emitted through an upper surface of the substrate 101. The white light emitting device 700' achieves white light by the mixture of the first emission light B and the second emission light R+G or Y.

Figure 17:
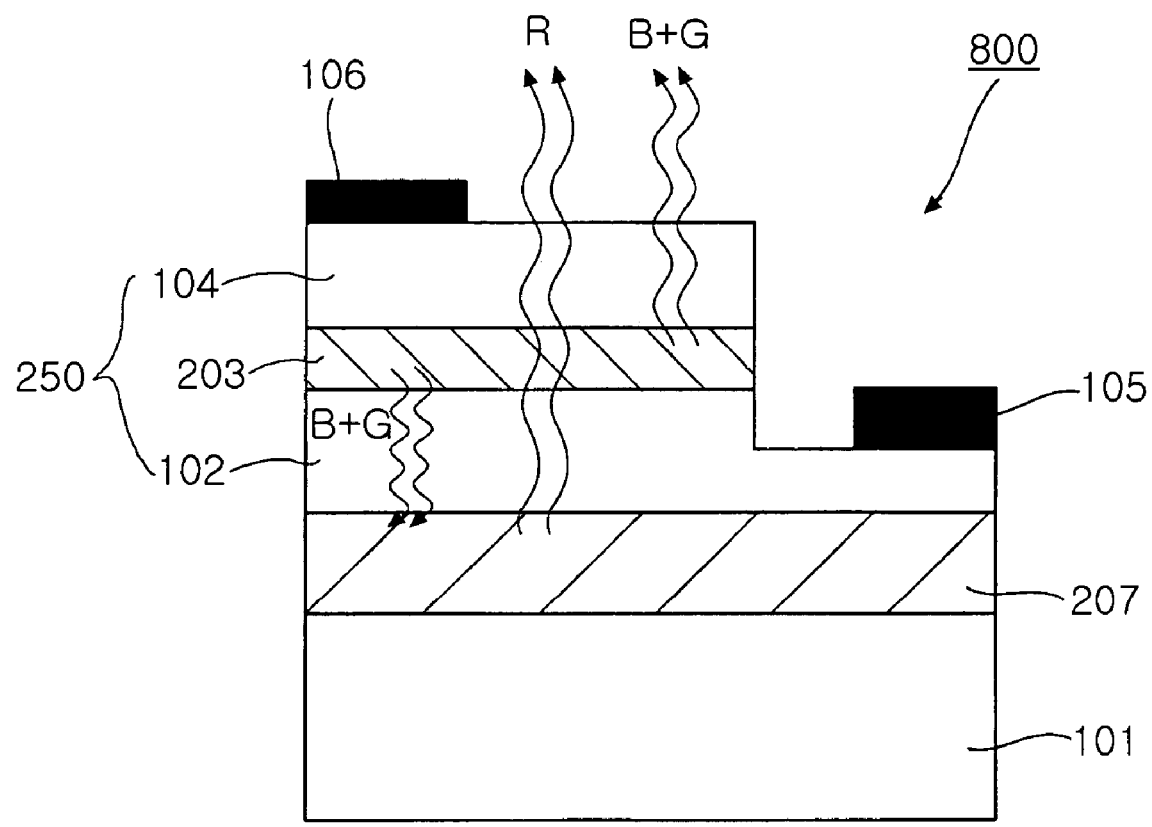

FIG. 17 is a sectional view illustrating a white light emitting device 800 according to further another embodiment of the present invention. The embodiment shown in FIG. 17 differs from the embodiment shown in FIG. 15 in that the first emission light is the light B+G in a wavelength range from blue to green and that the wavelength-converting film 207 converts the first emission light B+G to the second emission light of red light R. Referring to FIG. 17, a portion of the first emission light B+G emitted from the active layer 203 in the light emission structure 250 is emitted through an upper surface of the p-semiconductor layer 104. Another portion of the first emission light B+G is absorbed in the wavelength-converting film 207 and converted to the second emission light R, which is then emitted through an upper surface of the p-semiconductor layer 104. The white light emitting device 800 achieves white light by the mixture of the first emission light B+G and the second emission light R.

Figure 18:
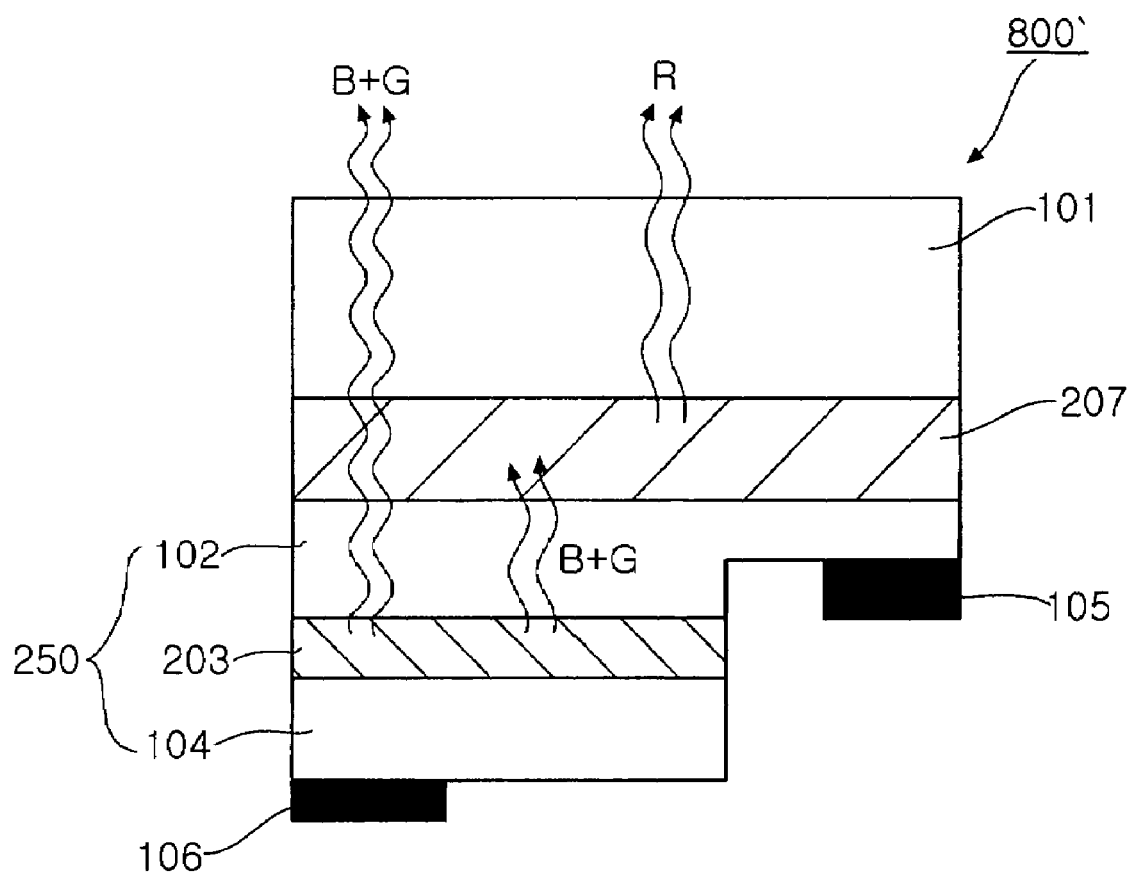

FIG. 18 is a sectional view illustrating a white light emitting device 800' according to yet another embodiment of the present invention. The embodiment shown in FIG. 18 is a variation from the embodiment shown in FIG. 17 and differs in that the light exiting surface is in the opposite direction. That is, as shown in FIG. 18, the upper surface of the substrate 101 is the light exiting surface. To facilitate emission through an upper surface of the substrate 101, a reflecting layer can be formed on a bottom surface of the p-semiconductor layer. Referring to FIG. 18, a portion of the first emission light B+G generated from the active layer 203 in the light emission structure 250 passes through the wavelength-converting film 207 and is emitted through an upper surface of the p-semiconductor layer 104 without wavelength conversion. Another portion of the first emission light B+G is absorbed in the wavelength-converting film 207 and converted to the second emission light R, which is then emitted through an upper surface of the p-semiconductor layer 104. The white light emitting device 800' achieves white light by the mixture of the first emission light B+G and the second emission light R.

As described hereinabove, white light can be achieved using a wavelength-converting film of europium-silicate without a package for containing phosphor, thereby allowing miniaturization of a white light emitting device. In addition, the europium-silicate is formed by a deposition process, and thus can be formed in a uniform thickness. This facilitates obtaining a uniform color and achieves superior color reproducibility of white light. Furthermore, the europium-silicate can easily adjust the light emission spectrum according to its fabrication conditions (compositions or phases). Therefore, it is advantageous for color combination. In addition, the present invention allows a simple fabrication process with reduced costs.

According to the present invention set forth above, europium-silicate can be used for a wavelength-converting film, which advantageously facilitates color combination and improves color reproducibility. This allows achieving white light with only a single chip without a package, enabling miniaturization of a light emitting device and a simpler fabrication process with reduced costs. Furthermore, the europium-silicate can be adjusted in its thickness, resulting in high quality white light in a uniform color.

While the present invention has been shown and described in connection with the exemplary embodiments, it will be apparent to those skilled in the art that modifications and variations can be made without departing from the spirit and scope of the invention as defined by the appended claims.

What is claimed is:

1. A white light emitting device comprising:
a substrate;
a light emission structure comprising an n-semiconductor layer, an active layer and a p-semiconductor layer sequentially formed on the substrate, the light emission structure emitting first emission light; and
a wavelength-converting film for absorbing and converting the first emission light to second emission light of another wavelength,
wherein the wavelength-converting film comprises europium-silicate.

2. The white light emitting device according to claim 1, wherein a portion of the first emission light is combined with the second emission light to produce white light.

3. The white light emitting device according to claim 1, wherein each of the p-semiconductor layer, the active layer and the n-semiconductor layer comprises a nitride semiconductor.

4. The white light emitting device according to claim 1, wherein the europium-silicate comprises a material having a composition formula of $Eu_xSi_yO_z$, where $0<X<30$, $0<Y<30$ and $0<Z<30$.

5. The white light emitting device according to claim 1, wherein the europium-silicate comprises a material having a composition formula of $Eu_xSi_yO_z$, where, $0<x<10$, $0<y<10$ and $0<z<10$.

6. The white light emitting device according to claim 1, wherein the europium-silicate comprises a material having a composition formula of $Eu_xSi_yO_z$, where $0<x<6$, $0<y<6$ and $0<z<6$.

7. The white light emitting device according to claim 1, wherein the wavelength-converting film is formed on at least one location selected from the group consisting of a bottom surface of the substrate, an upper surface of the p-semiconductor layer and between the substrate and the n-semiconductor layer.

8. The white light emitting device according to claim 7, wherein the first emission light comprises blue light, and the second emission light comprises light in a wavelength range from green to red, or yellow light.

9. The white light emitting device according to claim 7, wherein the first emission light comprises light in a wavelength range from blue to green, and the second emission light comprises yellow light.

10. The white light emitting device according to claim 7, wherein the first emission light comprises ultraviolet rays, and the second emission light comprises light in a wavelength range from blue to red.

11. The white light emitting device according to claim 7, wherein white light is emitted in a direction from the light emission structure upward, opposite to the substrate.

12. The white light emitting device according to claim 7, wherein white light is emitted in a direction from the substrate downward, opposite to the light emission structure.

* * * * *